(12) United States Patent
Fai et al.

(10) Patent No.: US 8,472,274 B2
(45) Date of Patent: Jun. 25, 2013

(54) USING TEMPERATURE SENSORS WITH A MEMORY DEVICE

(75) Inventors: Anthony Fai, Palo Alto, CA (US);
Nicholas Seroff, Los Gatos, CA (US);
Nir Jacob Wakrat, Log Gatos, CA (US)

(73) Assignee: Apple Inc., Cupertino, CA (US)

( * ) Notice: Subject to any disclaimer, the term of this patent is extended or adjusted under 35 U.S.C. 154(b) by 224 days.

(21) Appl. No.: 13/038,860

(22) Filed: Mar. 2, 2011

(65) Prior Publication Data
US 2012/0224425 A1    Sep. 6, 2012

(51) Int. Cl.
*G11C 7/04*    (2006.01)
*G11C 11/56*    (2006.01)

(52) U.S. Cl.
CPC .................................. *G11C 11/5642* (2013.01)
USPC .................. 365/211; 365/185.18; 365/185.2; 365/210.11; 365/185.09

(58) Field of Classification Search
CPC .. G11C 11/5642; G11C 16/26; G11C 16/3418; G11C 16/349; G11C 2211/5634
USPC .................... 365/185.09, 185.18, 185.2, 210, 365/211
See application file for complete search history.

(56) References Cited

U.S. PATENT DOCUMENTS

| | | |
|---|---|---|
| 7,342,831 B2 | 3/2008 | Mokhlesi et al. |
| 7,440,349 B2 | 10/2008 | Braun et al. |
| 7,743,203 B2 | 6/2010 | France |
| 7,755,946 B2 | 7/2010 | Dunga et al. |
| 7,957,189 B2 | 6/2011 | Avraham et al. |
| 8,171,318 B2 | 5/2012 | Cornwell et al. |
| 8,213,255 B2 | 7/2012 | Hemink et al. |
| 8,331,183 B2 | 12/2012 | Lee et al. |
| 2004/0188668 A1 | 9/2004 | Hamann et al. |
| 2005/0197795 A1 | 9/2005 | Aas et al. |
| 2006/0285408 A1 | 12/2006 | Betser et al. |
| 2009/0091979 A1 | 4/2009 | Shalvi |
| 2012/0102259 A1* | 4/2012 | Goss et al. ..................... 711/103 |

FOREIGN PATENT DOCUMENTS

| | | |
|---|---|---|
| EP | 1 403 874 A1 | 3/2004 |
| WO | 2005/024832 A2 | 3/2005 |
| WO | 2011/103013 A1 | 8/2011 |

OTHER PUBLICATIONS

Extended European Search Report in Application No. 12157876.0/2210, issued Jun. 4, 2012, pp. 1-6.

* cited by examiner

*Primary Examiner* — Thong Q Le
(74) *Attorney, Agent, or Firm* — Meyertons, Hood, Kivlin, Kowert & Goetzel, P.C.

(57) ABSTRACT

In one implementation, a method for performing memory operations includes receiving, at a memory device, a request to read data from one or more non-volatile memory cells; and retrieving stored temperature information associated with the non-volatile memory cells, wherein the temperature information is associated with a temperature at approximately at a time when the data was written to the non-volatile memory cells. The method can further include reading, by the memory device, the data from the non-volatile memory cells. The method can also include processing the read data based on, at least, the retrieved temperature information; and providing the processed data.

24 Claims, 6 Drawing Sheets

USING TEMPERATURE SENSORS WITH A MEMORY DEVICE

BACKGROUND

This document relates to performing memory operations using temperature information.

Various types of non-volatile memory (NVM), such as flash memory (e.g., NAND flash memory, NOR flash memory), can be used for mass storage. For example, consumer electronics (e.g., portable media players) use flash memory to store data, including music, videos, images, and other media or types of information.

Temperature sensors have been used in conjunction with various systems, such as laptop computer systems, to identify temperature conditions existing in such systems that may be damaging to system components, like processors. For example, temperature sensors have been placed in or around processors and used to identify temperature conditions that may cause damage to a processor and/or to control cooling systems (e.g., fans) or system operations (e.g., processor speed or level of activity).

SUMMARY

This document generally describes technologies relating to performing memory operations using temperature information associated with NVM. Temperature information associated with NVM can include temperature measurements from temperature sensors located in and around NVM (e.g., embedded on a NVM die) and/or temperature measurements from other temperature sensors that are associated with other components of a memory device (e.g., memory controller, ambient temperature sensor).

Temperature information can be used in a variety of ways by a memory device for performing memory operations. For example, information indicating a temperature of NVM when data is being programmed to the NVM can be stored and later used to select appropriate techniques for reading the programmed data. For instance, temperature information can be used to adjust one or more voltage thresholds for reading data from NVM. In another example, temperature information can be used to make adjustments to how data is stored, such as redundantly writing data to multiple storage locations instead of to a single storage location. A variety of other features related to the use of temperature information with memory operations are disclosed below.

In one implementation, a method for performing memory operations includes receiving, at a memory device, a request to read data from one or more non-volatile memory cells; and retrieving stored temperature information associated with the non-volatile memory cells, wherein the temperature information is associated with a temperature at approximately at a time when the data was written to the non-volatile memory cells. The method can further include reading, by the memory device, the data from the non-volatile memory cells. The method can also include processing the read data based on, at least, the retrieved temperature information; and providing the processed data.

In another implementation, a method for performing memory operations includes receiving, at a memory device, a request to write data to one or more non-volatile memory cells; and obtaining, by the memory device, temperature information from one or more temperature sensors indicating a current temperature associated with the non-volatile memory cells. The method can also include determining an adjustment to make to a write operation based on the temperature information. The method can further include writing the data to the non-volatile memory cells using the determined adjustment to the write operation based on the temperature information.

In another implementation, a memory device includes one or more non-volatile memory cells and one or more temperature sensors configured to provide temperature measurements associated with the non-volatile memory cells. The device can also include a controller configured to perform memory operations on the non-volatile memory cells, wherein the memory operations are adjusted based on the temperature measurements provided by the temperature sensors.

In another implementation a system includes one or more non-volatile memory cells, and one or more temperature sensors configured to provide temperature measurements associated with the non-volatile memory cells. The system can also include a controller configured to perform memory operations on the non-volatile memory cells, wherein the memory operations are adjusted based on the temperature measurements provided by the temperature sensors.

Particular embodiments of the subject matter described in this specification can be implemented so as to realize one or more of the following advantages. The integrity of data stored in NVM can be preserved in spite of changes in the temperature of the NVM. In another example, the temperature of NVM can be more accurately determined by using temperature sensors located in and around the NVM. In a further example, memory operations can be modified (e.g., switch to redundantly programming data) based on current temperature conditions within NVM in order to increase the integrity of data stored in the NVM.

The details of one or more embodiments are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
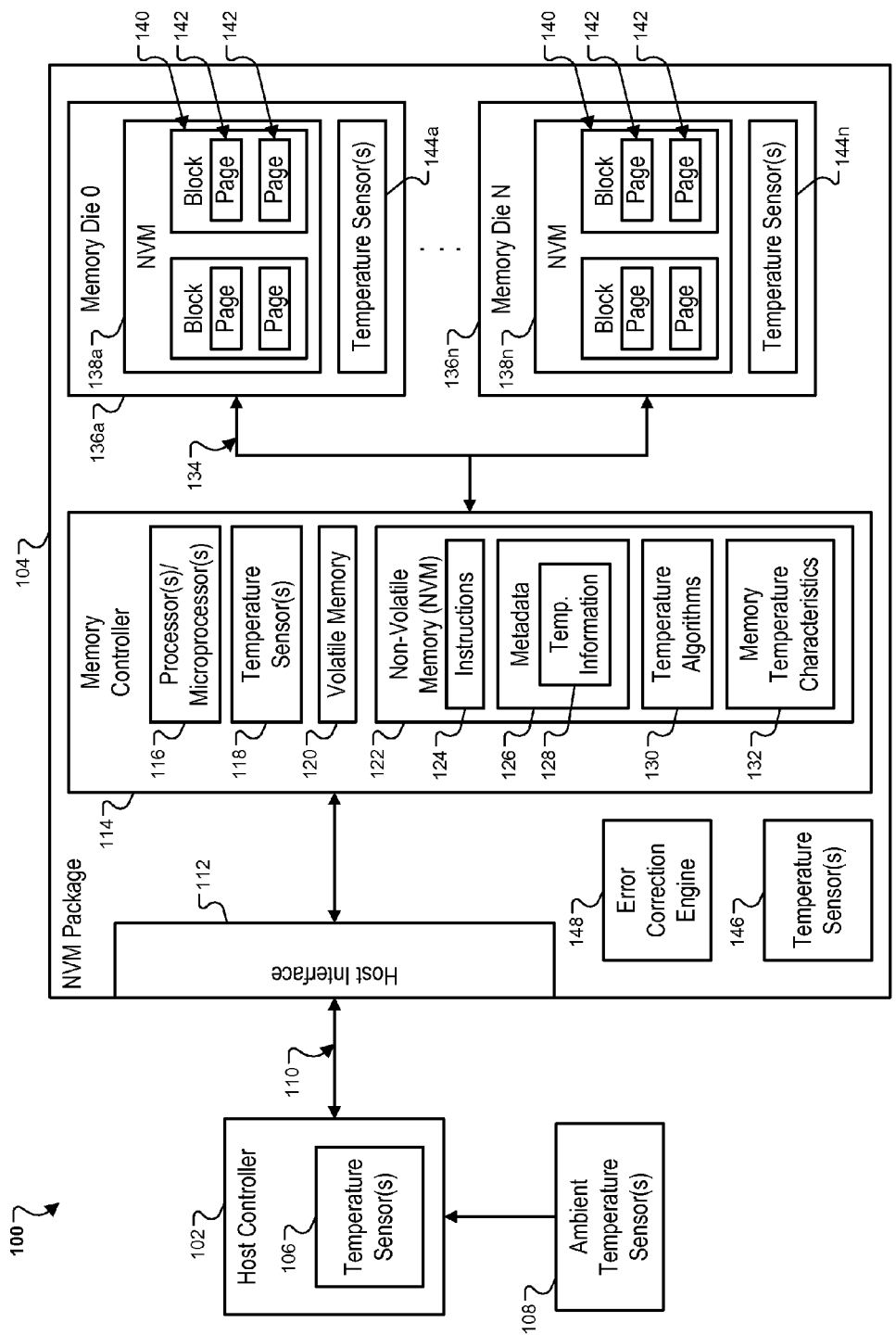
FIG. 1 is a diagram depicting an example system that includes a host controller and a NVM package that is configured to use temperature information to perform memory operations.

Memory operations can be performed using temperature information associated with NVM. Temperature information can indicate a temperature of NVM. Temperature information for NVM can be used to adjust memory operations that are performed on the NVM. Temperature information can be obtained from temperature sensors located around a memory device, including temperature sensors located in or around NVM (e.g., located on a NAND flash memory die).

The integrity of data stored in NVM can be affected by the temperature of the NVM. For example, the accuracy with which data is read from NVM may decrease as the NVM increases in temperature. For instance, a stored voltage in a memory cell may drift upward or downward as the temperature of the NVM changes. This can be problematic when translating stored voltage in NVM into digital data values, which correspond to various ranges of stored voltage. For instance, a "single-level cell" (SLC) stores a single bit of data, where a first voltage range corresponds to the data value '1' and a second voltage range corresponds to the data value '0.' If a stored voltage drifts from the first range into the second range due to temperature changes for the NVM, the data value from the memory cell can be misread as a '0' instead of as a '1.'

To address these and other issues, temperature information for NVM can be obtained, stored, and used to adjust memory operations. Temperature information for NVM can be obtained using various temperature sensors located throughout a memory device, including temperature sensors located in and around the NVM itself (e.g., located on a NVM die). For temperature sensors located outside the NVM (e.g., a temperature sensor located in a memory controller), temperature characteristics can be used to infer a temperature of the NVM based on measurements from such temperature sensors that are external to the NVM. Temperature characteristics map relationships between temperature measurements from one or more temperature sensors in a memory device and/or external to the memory device, such as a temperature sensor in a memory controller, and the approximate temperature of other components of the memory device, such as NVM.

Temperature information for NVM can be obtained when programming the NVM and used to adjust the programming operation. For example, temperature information for memory cells at or around the time of programming can be used to adjust voltage thresholds for a programming operation, data can be redundantly written to multiple storage locations, and/or memory cells can be changed from SLC mode to "multi-level cell" (MLC) mode (multiple bits of data stored in a memory cell), or vice versa.

Temperature information for NVM cells at or around the time of programming can be stored and later used for performing read operations for the NVM cells. For example, in response to receiving a command to read data from NVM, the temperature of the NVM at the time the requested data was programmed can be retrieved and compared to a current temperature of the NVM. Such a comparison can be used to approximate voltage drift for the NVM and, if appropriate, to adjust voltage thresholds used to read and interpret data values stored in NVM. These and other techniques can be used to provide a variety of improvements for NVM, such as improved data integrity for NVM.

FIG. 1 is a diagram depicting an example system 100 that includes a host controller 102 and a NVM package 104 that is configured to use temperature information to perform memory operations. For instance, the NVM package 104 can use temperature information indicating the temperature of NVM to program data to the NVM and to read data from the NVM in manners that adapt to temperature variations affecting data integrity. The host controller 102 and/or the NVM package 104 can be included in any of a variety of host devices and/or systems ("hosts"), such as a portable media player, a cellular telephone, a pocket-sized personal computer, a personal digital assistant (PDA), a desktop computer, a laptop computer, and/or a tablet computing device, to name a few possible examples.

The host controller 102 can include one or more processors and/or microprocessors that are configured to perform operations based on the execution of software and/or firmware instructions. Additionally and/or alternatively, the host controller 102 can include hardware-based components, such as ASICs, that are configured to perform various operations. Operations performed by the host controller 102 can include retrieving data from and/or writing data to a NVM of the NVM package 104. For example, the host controller 102 can provide a request for a media file (e.g., audio file) to the NVM package 104. Such a request provided by the host controller 102 can include one or more logical addresses corresponding to the media file.

The host controller 102 can include one or more temperature sensors 106 that are located in or around the host controller 102 and that provide temperature measurements for the host controller 102. For example, the temperature sensors 106 can provide temperature measurements that are can be used (by the host controller 102 and/or another component of a host system) to determine whether the host controller 102 is operating within a permissible temperature range for the host controller 102 (e.g., a preset temperature specification for the host controller 102).

The host controller 102 can also obtain temperature measurements for a host system from one or more ambient temperature sensors 108 that are located in and around the host system. For example, the ambient temperature sensors 108 can be positioned at various locations of a host system, such as on a board and/or affixed to a housing of the host system, and can be used by the host controller 102 (or other component of the host system) to determine temperature external to the host device and/or whether the system is operating within a permissible temperature range (e.g., a preset temperature specification for the host system).

The host controller 102 can communicate with the NVM package 104 over a host communication channel 110. The host communication channel 110 between the host controller 102 and the NVM package 104 the can be fixed (e.g., fixed communications channel) and/or detachable (e.g., a universal serial bus (USB) port). Interactions with the NVM package 104 can include providing memory related requests to the NVM package 104, such as requests to retrieve data stored in the NVM package 104 and/or store data in the NVM package 104. The host controller 102 can also provide temperature measurements obtained from the temperature sensors 106-108, and/or measurements from other temperature sensors not depicted, to the NVM package 104 for use by the NVM package 104 for performing memory operations.

The NVM package 104 can interact with the host controller 102 over the host communication channel 110 using a host interface 112 and a memory controller 114. Like the host controller 102, the memory controller 114 can include one or more processors and/or microprocessors 116 that are configured to perform operations based on the execution of software and/or firmware instructions. Additionally and/or alternatively, the memory controller 114 can include hardware-based components, such as ASICs, that are configured to perform various operations. The memory controller 114 can perform a variety of operations, including memory operations requested by the host controller 102. For example, in response to receiving a request specifying a logical address of a media file to be retrieved, the memory controller 114 can identify one or more corresponding physical addresses (e.g., information identifying die, block, and/or page), retrieve the requested data using the identified physical addresses, and transmit the requested data to the host controller 102 over the host communication channel 110 using the host interface 112.

Various memory management functions, such as wear leveling, can be performed by the host controller 102 and the memory controller 114, alone or in combination. In implementations where the memory controller 114 is configured to perform at least some memory management functions, the NVM package 104 can be termed "managed NVM" (or "managed NAND" for NAND flash memory). This can be in contrast to "raw NVM" (or "raw NAND" for NAND flash memory), in which the host controller 102 external to the NVM package 104 performs memory management functions for the NVM package 104.

The host controller 102 and the NVM package 104 can be part of the same memory device. Although there can be some overlap, the host controller 102 and the NVM package 104 can perform different roles on the memory device. For instance, the host controller 102 can perform and provide user-facing functionality for the memory device, such as performing operations to provide a user-interface (e.g., graphical user interface, text-based user interface, audio user interface) and responding to user input (e.g., requests to play a particular media file). The NVM package 104 can perform and provide memory-based functionality for the memory device, such as implementing memory access requests from the host controller 102 (e.g., converting from logical to physical addressing), performing memory management operations, and/or performing error correction operations. Some of these roles can be shared, such as the host controller 102 performing some memory operations, such as memory management operations.

In the example system 100, the memory controller 114 is depicted as including one or more temperature sensors 118, volatile memory 120, and non-volatile memory 122. The temperature sensors 118 can be located in or around the memory controller 114 and can provide temperature measurements for the memory controller 114. These temperature measurements can be used by the memory controller 114, and/or by another component of the NVM package 104, to determine whether the memory controller 114 (or one or more other components) is operating within a permissible temperature range (e.g., within a temperature specification for the memory controller 114). The memory controller 114 can use temperature measurements from the temperature sensors 118 to perform and adjust memory operations for the NVM package 104, as described in greater detail below.

The volatile memory 120 can be any of a variety of volatile memory, such as cache memory and random access memory (RAM). The volatile memory 120 can be used by the memory controller 114 to perform memory operations (including temperature-based adjustments to memory operations), to store data that is being read from and/or written to NVM, and to store temperature information associated with NVM.

The NVM 122 can be any of a variety of types of NVM and can store instructions 124 that the memory controller 114 uses to perform various operations, including temperature-based adjustments to memory operations, as described in further detail below. The NVM 112 can also store metadata 126 associated with NVM. The metadata includes information that describes, in various ways, the data stored in the NVM of the NVM package 104. For example, the metadata 126 can include temperature information 128 that indicates a temperature of one or more memory cells (e.g., a block of memory cells) at the time the memory cells were programmed. The temperature information 128, and/or other portions of the metadata 126, can include a variety of additional information regarding the NVM of the NVM package 104, such as timestamp information (e.g., time at which a memory cell was previously programmed) and/or wear information (e.g., information indicating a number of times various portions of NVM have been programmed). The temperature information 128 can be stored using any of a variety of temperature scales, such as Fahrenheit, Celsius, Kelvin, and raw digital/analog temperature sensor output.

The NVM 122 of the memory controller 114 can also include temperature algorithms 130 and/or memory temperature characteristics 132. Temperature algorithms 130 are algorithms that map the temperature of (or changes in the temperature of) NVM (and possibly other input data) to the level of or changes in the charge stored in NVM. For example, the temperature algorithms 130 can map an amount and direction of voltage drift in NVM memory cells to temperature changes in the NVM memory cells. The temperature algorithms 130 can take as input temperature information (e.g., temperature of NVM at time of programming, current temperature of NVM, elapsed time since programming) and other detected conditions and/or metadata and can provide as output, among other things, information indicating various adjustments to make to memory operations (e.g., adjust read and/or write voltage thresholds, change from MLC mode to SLC mode, redundantly program data).

The NVM 122 of the memory controller 114 can also include the memory temperature characteristics 132, which can be used in conjunction with the temperature algorithms 130. The memory temperature characteristics 132 can be used to infer the temperature of a portion of NVM (e.g., a NVM die, a NVM page, a NVM block, one or more NVM cells) based on temperature measurements from various temperature sensors, such as the temperature sensors 106, 108, 118, and others. The memory temperature characteristics can map a temperature measurement from one or more temperature sensors to a temperature of a portion of NVM. The inferred temperature for a portion of NVM can be stored as metadata (e.g., the temperature information 128) and/or can be used as input for the temperature algorithms 130. In some implementations, as will be described in more detail below, temperature sensors may be located in or around NVM and temperature characteristics may not need to be used to infer the temperature of such NVM—instead, measurements from such temperature sensors may provide a sufficiently accurate indication of the temperature of such NVM.

The memory controller 114 uses a shared internal bus 134 to access multiple memory dies 136a-n, which can be integrated circuit (IC) dies. Although only the single shared bus 134 is depicted with regard to the NVM package 104, an NVM package can include more than one shared internal bus. Each internal bus can be connected to multiple (e.g., 2, 3, 4, 8, 32, etc.) memory dies, as depicted by the multiple memory dies 136a-n. The memory dies 136a-n can be physically arranged in a variety of configurations (e.g., stacked). The memory dies 136a-n are depicted as including NVM 138a-n. The NVM 138a-n can be any of a variety of different types of NVM, such as NAND flash memory based on floating gate or charge trapping technology, NOR flash memory, erasable programmable read only memory (EPROM), electrically erasable programmable read only memory (EEPROM), ferroelectric RAM (FRAM), magnetoresistive RAM (MRAM), phase change memory (PCM), or any combination thereof. In some implementations, NVM 122 can be implemented in one or more of the memory dies 136a-n.

The NVM 138a-n can be organized (physically and/or virtually) into one or more sub-units of NVM, such as blocks 140 and pages 142. As depicted in the example system 100, the blocks 140 each include multiple pages 142. The blocks 140 and/or the pages 142 can correspond to portions of the NVM 138a-n that are programmed, read, and/or erased together. For instance, with NAND flash memory (an example of the NVM 138a-n), the pages 142 can correspond to a group of memory cells that are read and/or programmed together (at the same time), and the blocks 140 can correspond to a group of pages that are erased together. The size and configuration of the blocks 140 and the pages 142 can vary. For example, each of the blocks 140 can include any number of pages (e.g., 32 pages, 64 pages, thousands of pages), and each page can have an associated storage capacity from a few bytes (e.g., 512 bytes) and upward. Other divisions of the NVM 138a-n into sub-units are also possible.

The memory dies 136a-n can also each include one or more temperature sensors 144a-n that are located in or around the NVM 138a-n. For example, the memory die 136a can include one or more temperature sensors that are included in, on, or spaced throughout the die 136a and that provide temperature measurements corresponding to the NVM 138a-n. The temperature measurements from the temperature sensors 144a-n can be provided to the memory controller 114 over the internal bus 134 and/or one or more other internal channels (not depicted) between the memory dies 136a-n and the memory controller 114. The temperature measurements from the temperature sensors 144a-n can be used to determine the temperature of a portion of NVM, which can used in a variety of ways, for instance, to store temperature information 128 and/or to adjust various parameters (e.g., threshold voltage levels) of a memory operation (e.g., program, read, erase).

The temperature information 128 can include data that indicates temperatures of various portions of the memory dies 136a-n, such as the NVM 138a-n, the blocks 140, the pages 142, and/or individual memory cells. For example, if one of the pages of the NVM 138a is programmed while the temperature of the page is 90° F. (e.g., as indicated by the temperature sensor 144a), the memory controller 114 can record such temperature information as metadata 128 corresponding to the programmed page. For instance, the temperature information 128 for the programmed page can include the temperature (90° F.), an identifier for the programmed page (e.g., physical address for the page, logical address range corresponding to the page), and/or a timestamp corresponding to a time at which the page was programmed.

The NVM package 104 can also include one or more temperature sensors 146 that are part of the package 104 without a specific association with the memory controller 114 and/or the memory dies 136a-n. The temperature sensors 146 can be associated with other components of the NVM package 104 and/or can serve as ambient temperature sensors for the NVM package 104. Like temperature measurements from the other temperature sensors not specifically associated with the NVM 138a-n (e.g., ambient temperature sensors 108, temperature sensors 106, temperature sensors 118), temperature measurements from the temperature sensors 146 can be used to determine the temperature of a portion of NVM, which can used in a variety of ways, for instance, to store temperature information 128 and/or to adjust various parameters (e.g., threshold voltage levels) of a memory operation (e.g., program, read, erase).

The NVM package 104 can also include an error correction engine 148 (e.g., an error-correcting code engine) that corrects errors in data read from the NVM 138a-n. The error correction engine 148 can be implemented in hardware and/or software, and can be part of or separate from the memory controller 114. The error correction engine 148 can be used to determine whether the temperature algorithms 130 are providing accurate temperature-based adjustments to voltage thresholds used to interpret voltage levels detected in the NVM 138a-n. The memory controller 114 can adjust the temperature algorithms 130 based on whether errors are detected by the error correction engine 148. In some implementations, the error correction engine 148 (or a separate error correction engine) can be used to perform other types of error correction operations.

For example, if a page of the NVM 138a is programmed at a first temperature and then read at a second temperature, the memory controller 114 can adjust one or more of the voltage thresholds used to interpret voltage levels stored in the page as digital data values (e.g., 0, 1) based on one or more of the temperature algorithms 130, and the first and second temperatures. The error correction engine 148 can determine whether there are any errors in the digital data values resulting from interpretation of the voltages stored in the page using the adjustments to the voltage thresholds. If there are at least a threshold number of errors (e.g., raw number, percentage) and/or if there are uncorrectable errors (e.g., errors for which the error correction engine 148 is unable to determine a correct data value), the memory controller 114 may adjust the one or more of the temperature algorithms 130 used to read the page (e.g., to alter the amount of adjustment to detected values based on temperature variations between the time of programming data into the memory and the time of reading data from the memory) and then may perform the read and error checking operation again to determine whether the encountered errors are resolved. This dynamic adjustment of the temperature algorithms 130 can be performed iteratively until at least a threshold number of the detected errors are resolved and/or until a threshold number of iterations are reached.

Although not depicted, various techniques and/or components described in association with the memory controller 114 can be performed by and/or included in the host controller 102. For example, some or all of the metadata 126 and/or the temperature information 128 can be stored in NVM associated with the host controller 102 (not depicted). In such an implementation, the host controller 102 can provide to and/or receive from the NVM package 104 relevant temperature information to in association with memory operations (e.g., program, read, erase).

Figure 2:
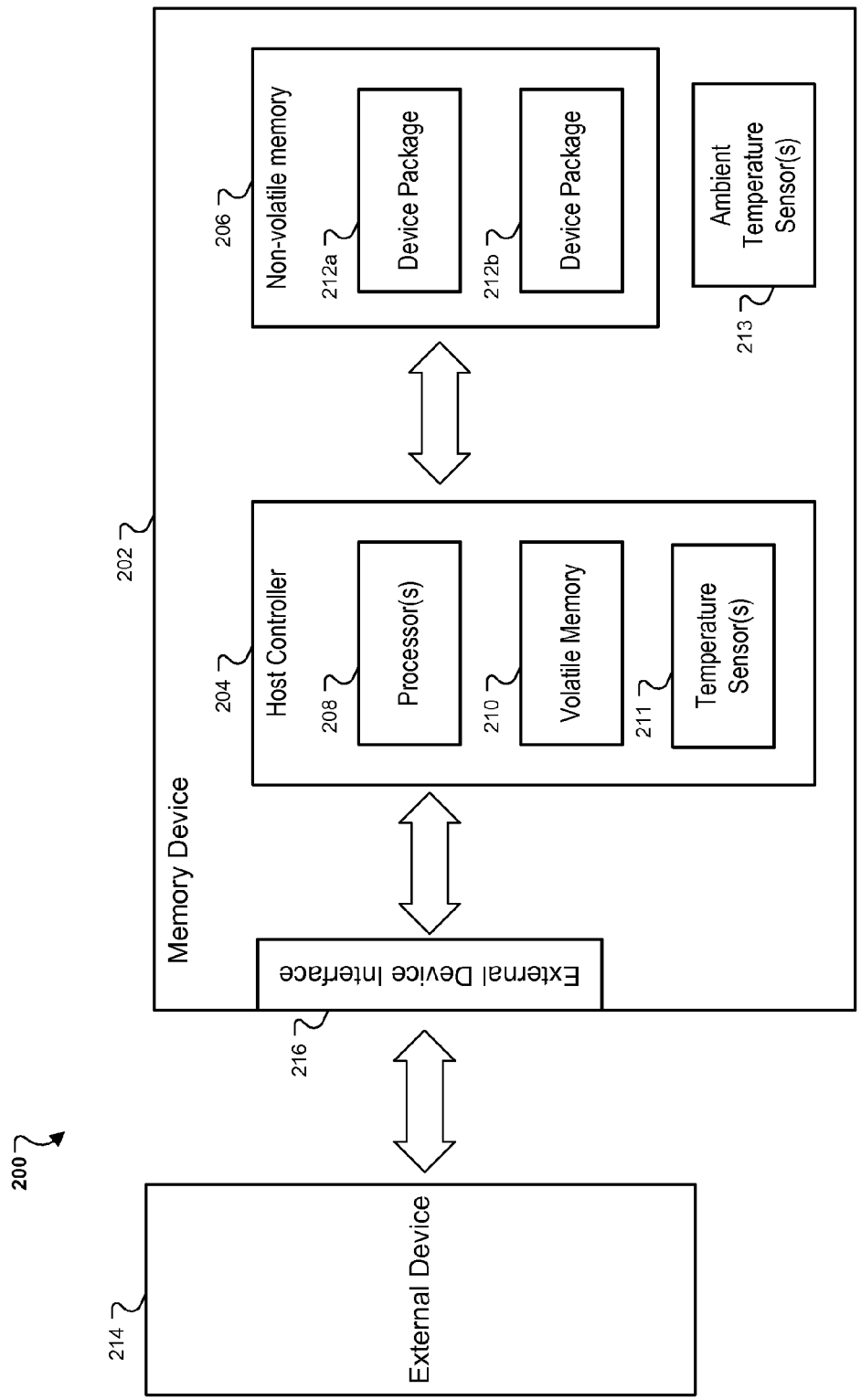
FIG. 2 is a diagram depicting an example system that includes a memory device configured to use temperature information to perform memory operations.

FIG. 2 is a diagram depicting an example system 200 that includes a memory device 202 configured to use temperature information to perform memory operations. The memory device 202 can be any of a variety of memory devices, such as a portable media player, a cellular telephone, a pocket-sized personal computer, a personal digital assistant, a desktop computer, a laptop computer, a tablet computing device, and/or a removable/portable storage device (e.g., a flash memory card, a USB flash memory drive).

The example memory device 202 is depicted as including a host controller 204 and NVM 206. The host controller 204 can be similar to the host controller 102 described above with regard to FIG. 1. The host controller 204 includes one or more processors 208, volatile memory 210, and one or more temperature sensors 211. The processors 208 can be any variety of processors, such as microprocessors, central processing units (CPUs), graphics processing units (GPUs), or any combination thereof. The volatile memory 210 can be similar to the volatile memory 120 described above with regard to FIG. 1. The volatile memory 210 can be used by the processors 208 to perform various operations, such as retrieving and processing data stored in the NVM 206. The temperature sensors can be similar to the temperature sensors 106 described above with regard to FIG. 1.

The NVM 206 can include one or more NVM packages 212a-b. The NVM packages 212a-b can each be similar to the NVM package 104 described above with regard to FIG. 1. For instance, the NVM packages 212a-b can each include a plurality of memory dies with NVM (e.g., memory dies 138a-n and NVM 140a-n) and one or more memory controllers (e.g., memory controller 114) that are configured to use temperature information associated with the NVM packages 212a-b to perform memory operations. Each of the NVM packages 212a-b (alone, or in association with each other and/or the host controller 204) can collect, maintain, and use temperature information to perform memory operations associated with each respective package. The NVM 206 can include any number of NVM packages (e.g., 2, 3, 4, 8, 16, etc.).

As described above with regard to FIG. 1, management of the NVM can be performed by the host controller 204 and/or controllers of the NVM packages 212a-b. For instance, the host controller 204 can be configured to adjust operation of the NVM packages 212a-b (e.g., switch from MLC mode to SLC mode) based on the temperature information provided to and/or stored by the host controller 204. In implementations where controllers of the NVM packages 212a-b control at least a portion of the memory management operations (e.g., error correction, wear leveling, etc.), the NVM packages 212a-b may be considered to be "managed" NVM.

The memory device 202 can also include one or more ambient temperature sensors 213. The ambient temperature sensors 213 can be similar to the ambient temperature sensors 108 described above with regard to FIG. 1.

The system 200 is depicted as also including an external device 214 that can be communicatively connected (directly and/or indirectly) to the memory device 202. Communication between the external device 214 and the memory device 202 can include the transmission of data and/or instructions between the two devices. The external device 214 can be any of a variety of electronic devices, such as a desktop computer, a laptop computer, and a media computing device (e.g., a media server, a television, a stereo system). The memory device 202 can communicate with the external device 214 through a physical and/or wireless connection using an external device interface 216 (e.g., wireless chip, USB interface, etc.).

For instance, in one example implementation, the memory device 202 can be a portable media player and the external device 214 can be a desktop computer that can transmit media files (e.g., audio files, video files, etc.) to each other over a physical connection (e.g., USB cable).

Figure 3:
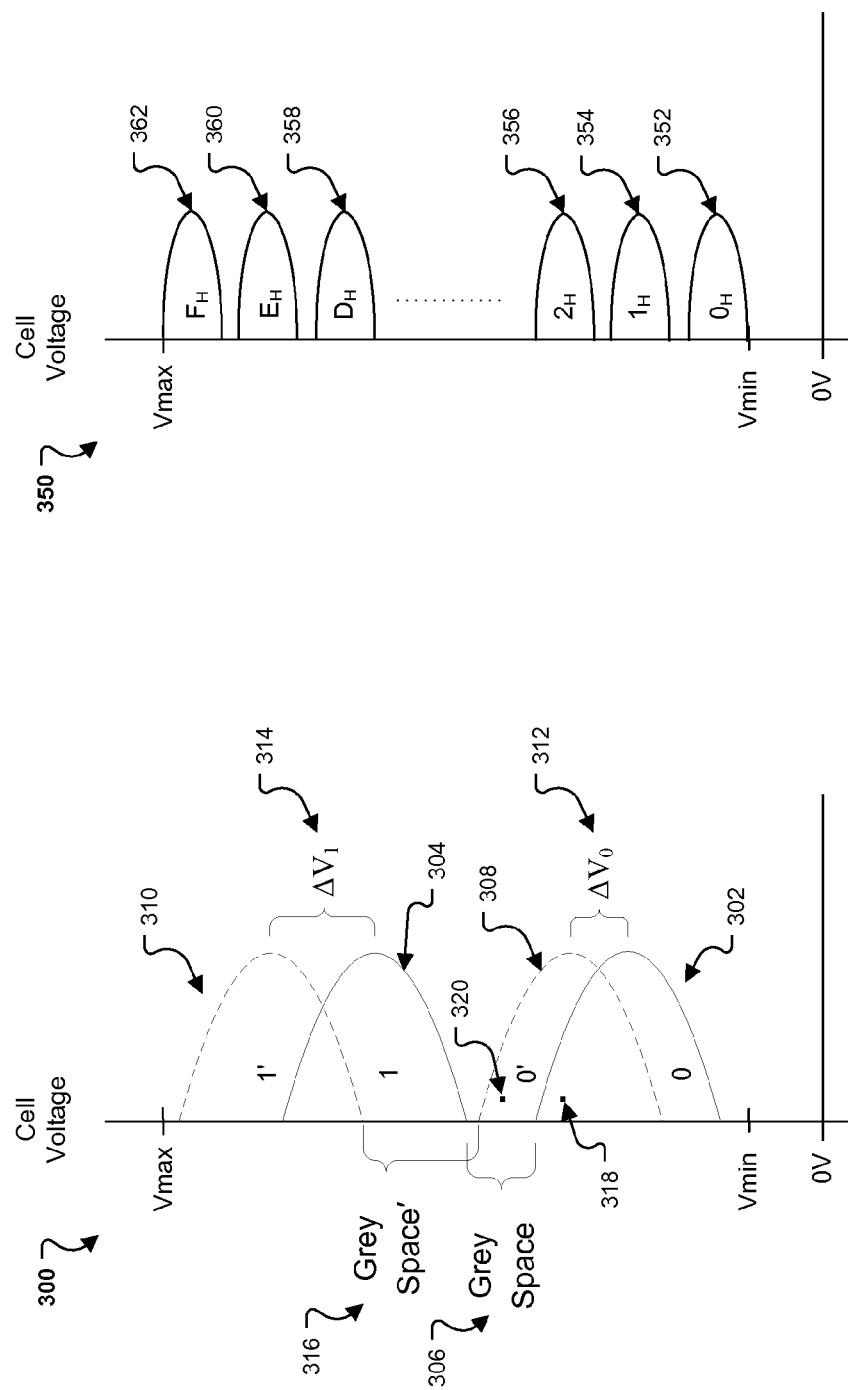
FIGS. 3A-B depict example mappings between cell voltages and digital data values for memory cells in single-level cell and multi-level cell modes, respectively.

FIGS. 3A-B depict example mappings between cell voltages and digital data values for memory cells in SLC and MLC modes, respectively. As described above with regard to FIG. 1, temperature information can be used to determine whether to switch memory cells between SLC mode and MLC mode.

FIG. 3A depicts an example digital data value distribution 300 for a memory cell operating in SLC mode (one bit of data stored per memory cell). In this example, voltage distribution curve 302 represents the digital value 0 and voltage distribution curve 304 represents the digital value 1. For instance, a voltage read from the memory cell that falls within the range bounded by the voltage distribution curve 302 will be interpreted as the digital data value 0. Voltage thresholds can be used to determine the boundaries of the distribution curves 302 and 304. For instance, the distribution curve 302 can be bounded by a lower voltage threshold (defining the minimum voltage of the distribution curve 302) and an upper voltage threshold (defining the maximum voltage for the distribution curve 302).

The area between the distribution curves 302 and 304 is depicted as grey space 306. Voltages falling within the grey space 306 can be interpreted as having uncertain data values, for which various techniques may be used to determine a correct data value, such as using error-correcting code (ECC).

A voltage stored in the example memory cell depicted in FIG. 3A can drift (change) in response to fluctuations in the temperature of the memory cell. Voltage distribution curves 308 and 310 depict an example voltage drift corresponding to the voltage distribution curves 302 and 304, respectively. For example, voltage values originally falling within the distribution curve 304 have drifted upward, based on temperature changes in the memory cell (e.g., increased temperature, decreased temperature), such that those voltage values now fall within the distribution curve 310. The voltage drift in this example is depicted as $\Delta V_0$ (312) and $\Delta V_1$ (314). Voltage drift can be uniform and/or non-uniform across the voltage range stored in a memory cell. In this example, the voltage drift is depicted as being non-uniform $-\Delta V_1$ (314) is presented as being greater than $\Delta V_0$ (312). In addition to the voltage distribution curves shifting, the grey space 306 in this example drifts to grey space' 316.

If, in light of temperature-based voltage drift, the voltage thresholds that correspond to the distribution curves 302 and 304 are not adjusted to correspond (within a threshold margin) to the distribution curves 308 and 310, respectively, stored voltage levels within this example memory cell can be misinterpreted. For instance, stored voltage 318 may drift to voltage 320 and, using the voltage thresholds defining the distribution curves 302 and 304, the voltage 320 will be interpreted as an uncertain data value. This uncertainty may trigger a variety of operations, like error correction, that can consume cycles from an associated processor/microprocessor (e.g., the processor/microprocessor 316). However, using the techniques described in this document, knowledge of the temperature at the time of programming, knowledge of the temperature at the time of reading, and/or a comparison of the temperature at the time the voltage 318 was programmed and the temperature when reading voltage 320 can allow for voltage thresholds corresponding to the distribution curves 302 and 304 to be adjusted to correspond to the distribution curves 308 and 310, respectively.

FIG. 3B depicts an example digital data value distribution 350 for a memory cell operating in MLC mode (more than one bit of data stored per memory cell). In this example, the memory cell is configured to store 4-bits of data, as indicated by the voltage distribution curves 352-362. The voltage distribution curves 352-362 in MLC mode can be smaller than the voltage distribution curves 302-304 in SLC mode, as depicted in FIG. 3A—small amounts of voltage drift may more likely cause data values to be misread in MLC mode than in SLC mode. Temperature information can be used to determine when to switch between MLC and SLC modes. For instance, if a large temperature change is detected for a memory cell in MLC mode and a corresponding temperature algorithm (e.g., temperature algorithms 130), taking the temperature change as input, provides output indicating that the voltage stored in the memory cell is likely to drift by at least a threshold amount, then the memory cell may be switched from MLC mode to SLC mode.

Figure 4:
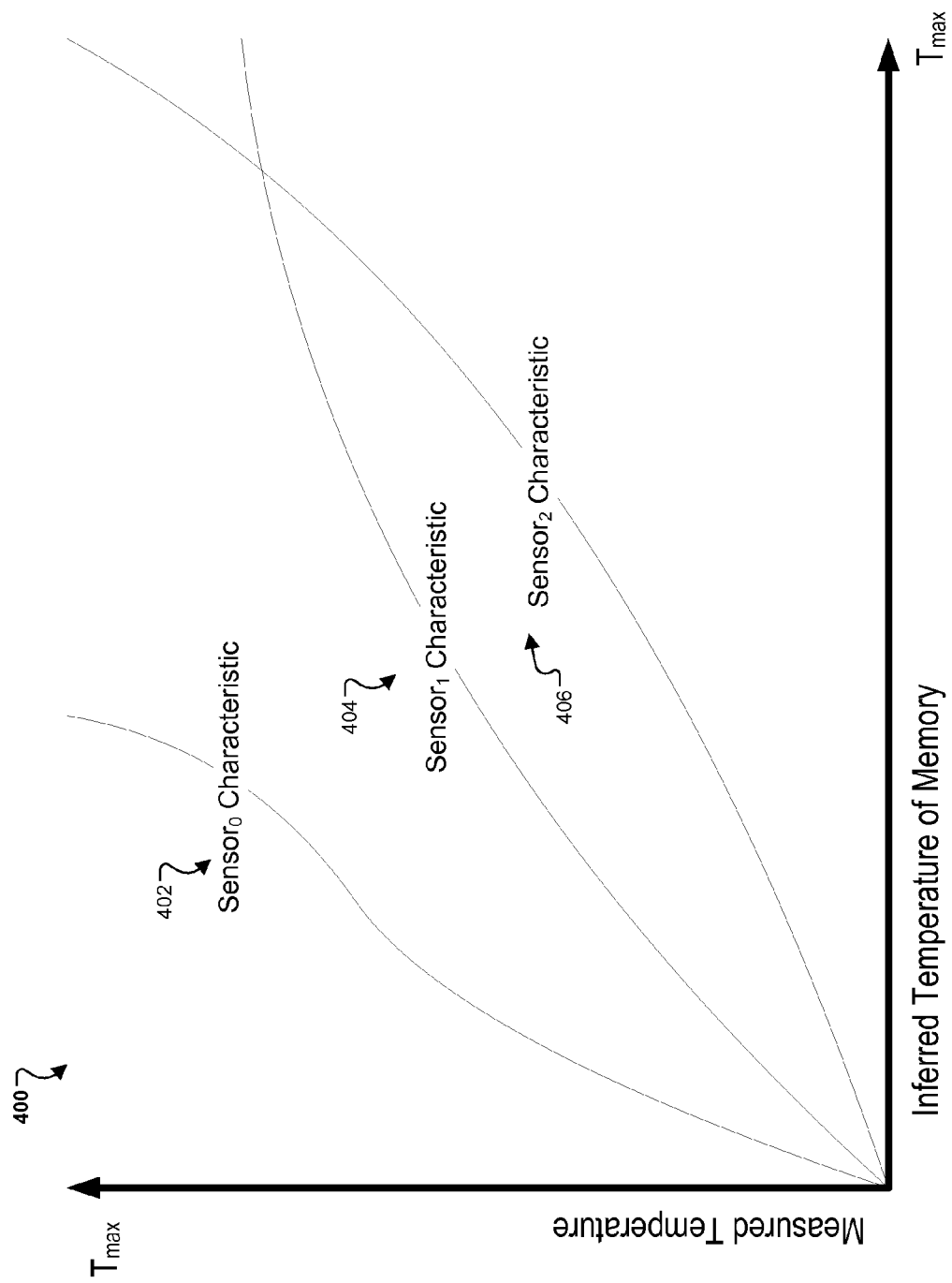
FIG. 4 is a graph that depicts example memory temperature characteristics.

FIG. 4 is a graph 400 that depicts example memory temperature characteristics 402-406. As described above with regard to FIG. 1 and the memory temperature characteristics 132, the memory temperature characteristics 402-406 can be used to infer the temperature of a portion of NVM (e.g., a NVM die, a NVM block, a NVM page) based on a temperature measurement from a temperature sensors that are located in, around, and/or external to the portion of NVM.

For example, the temperature characteristic 402 could correspond to the temperature sensor 146 that is part of the NVM package 104, and could be used to infer a temperature of the NVMs 138a-n, different temperatures among the NVMs 138a-n, or different temperatures of the various sub-units of the NVM 138a-n, such as the blocks 140 and the pages 142, based on temperature measurements from the temperature sensor 146.

The temperature characteristics 402-406 can be developed through a variety of techniques, such as analyzing empirical evidence correlating various temperature sensor measurements and NVM temperatures. The behavior of each NVM 138a-n may vary depend on the measured temperature or the inferred temperature in ways that can be modeled or otherwise represented by temperature algorithms that are used to interpret data based on temperature at the time of programming, temperature at the time of reading, and/or temperature differences between the time of programming and the time of reading.

Figure 5:
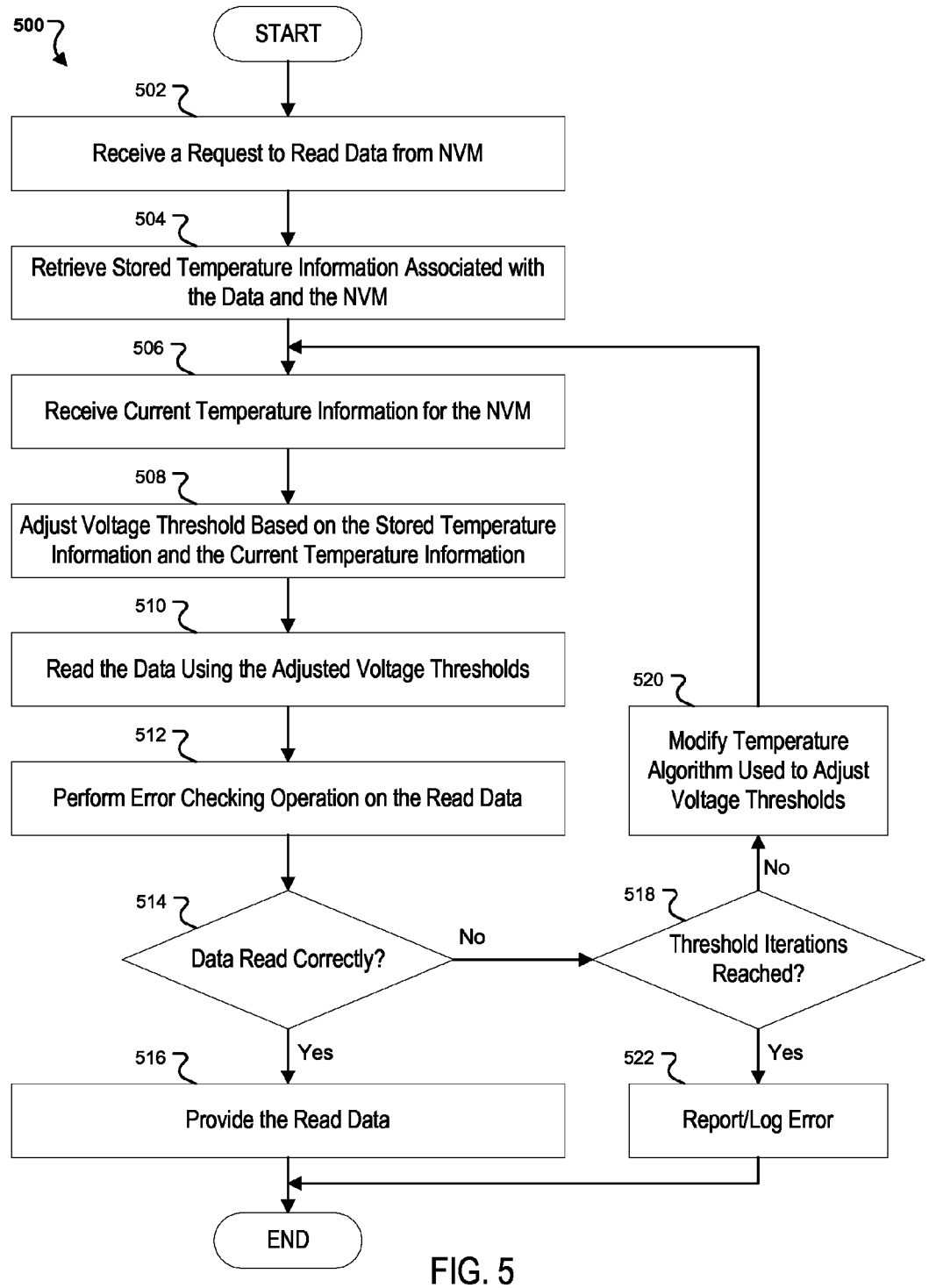
FIG. 5 is a flowchart depicting an example process for reading data from a memory device based on temperature information.

FIG. 5 is a flowchart depicting an example process 500 for reading data from a memory device based on temperature information. The process 500 can be performed by a variety of memory devices, such as the NVM package 104 and/or the host controller 102 described above with regard to FIG. 1, and/or the memory device 202 described above with regard to FIG. 2.

A request to read data from NVM is received at 502. For example, the host controller 102 can transmit a command to read data from the NVM 138a-n to the NVM package 104 over the host communication channel 110. Such a command can include one or more logical addresses to be read from the NVM 138a-n, which the NVM package 104 can translate into corresponding physical addresses in the NVM 138a-n.

In response to receiving the request, stored temperature information associated with the requested data and the NVM is retrieved at 504. As described above with regard to FIG. 1, stored temperature information can be metadata that describes the temperature of one or more portions of NVM (e.g., die, block, page, memory cells) at or around the time data was most recently written to the portions of the NVM. For example, the memory controller 114 can retrieve temperature information associated with the portion of NVM that is storing the requested data from the temperature information 128.

Current temperature information for the NVM can be received from one or more temperature sensors at 506. For example, if the requested data is stored in the NVM 138a, temperature measurements can be obtained from the temperature sensor(s) 144a that are located in or around the NVM 138a. In another example, temperature measurements can be obtained from other temperature sensors, such as the temperature sensor(s) 148 that are part of the NVM package 104 and/or the ambient temperature sensor(s) 108. The temperature measurements can be used in conjunction with a memory temperature characteristic (e.g., memory temperature characteristics 132), which maps temperature measurements of various temperature sensors to temperature values for portions of the NVM, to determine a current temperature for the NVM from the received temperature measurements.

Voltage thresholds that are used to interpret voltage levels stored in the NVM can be adjusted based on the stored temperature information and the current temperature information at 508. Such adjustments can be made using one or more temperature algorithms (e.g., the temperature algorithms 130) that map temperature changes to voltage drift in the NVM.

For example, referring to FIG. 3A, a memory cell is charged to voltage level 318, which corresponds to data value 0 (as interpreted using voltage distributions 302 and 304) while the memory cell is at a first temperature. As the memory cell changes temperature, the stored voltage level 318 may drift up or down. As depicted in the example in FIG. 3A, a change in temperature can cause the voltage 318 to drift to voltage 320, which is in grey space 306 (when using the voltage distributions 302 and 304). One or more temperature algorithms that correlate relationships between temperature changes in a memory cell and voltage drift within a memory cell can be used to determine how to adjust the voltage thresholds for the voltage distributions 302 and 304 so that the data value stored within the memory cell can be properly interpreted. Based on application of such an algorithm to the state of the memory cell (e.g., previous temperature at programming, current temperature at reading), the voltage thresholds can be adjusted and can result in voltage distributions 308 and 310. Such temperature algorithms can take a variety of information as input, such as the temperature of a memory cell at programming, the temperature of the memory cell at reading, the difference between the two temperatures, the wear on the memory cell (e.g., number of times programmed, erased, and read), a type of memory cell (e.g., NOR flash memory cell, NAND flash memory cell), and/or previous errors associated with the cell.

The requested data can be read using the adjusted voltage thresholds at 510. For example, referring to FIG. 3A, the adjusted voltage thresholds (which can define the bounds of the voltage distributions 308 and 310) can be used to read and interpret the stored voltage 320.

One or more error checking operations can be performed on the read data at 512. For example, the NVM package 104 can use the error correction engine 148 to determine whether there are any errors in the read data. If the data is determined to have been read correctly (514), then the read data can be used by and/or provided to the requesting entity at 516. For example, if the host controller 102 requests data from the NVM package 104, then the correctly read data can be provided to the host controller 102.

If the data is not read correctly (514), then the temperature algorithm that is being used to adjust the voltage thresholds can be modified at 520 (e.g., replaced by a different algorithm, adjust coefficients defining the relationship between temperature and voltage drift). With the modified algorithm, another iteration of obtaining the current temperature of the NVM (506), adjusting the voltage thresholds (508), reading the data using the adjusted thresholds (510), and/or performing an error checking operation (512) can be performed. This iterative process can continue unit the requested data is read correctly at 514 (e.g., within a threshold margin of being correct) and/or until a threshold number of iterations has been reached at 518. Such iterative adjustments to the temperature algorithms can allow for the temperature algorithms to dynamically adapt to changes in the NVM, such as degradation over time.

If the threshold number of iterations has been reached without having correctly identified the stored data value, then the error can be reported and/or logged at 522. For example, the memory controller 114 can log such as error as a part of the metadata 126 associated with one or more portions of the NVM 138a-n. In another example, a read error can be provided to the host controller 102 in response to a request from the host controller 102 for the data.

Figure 6:
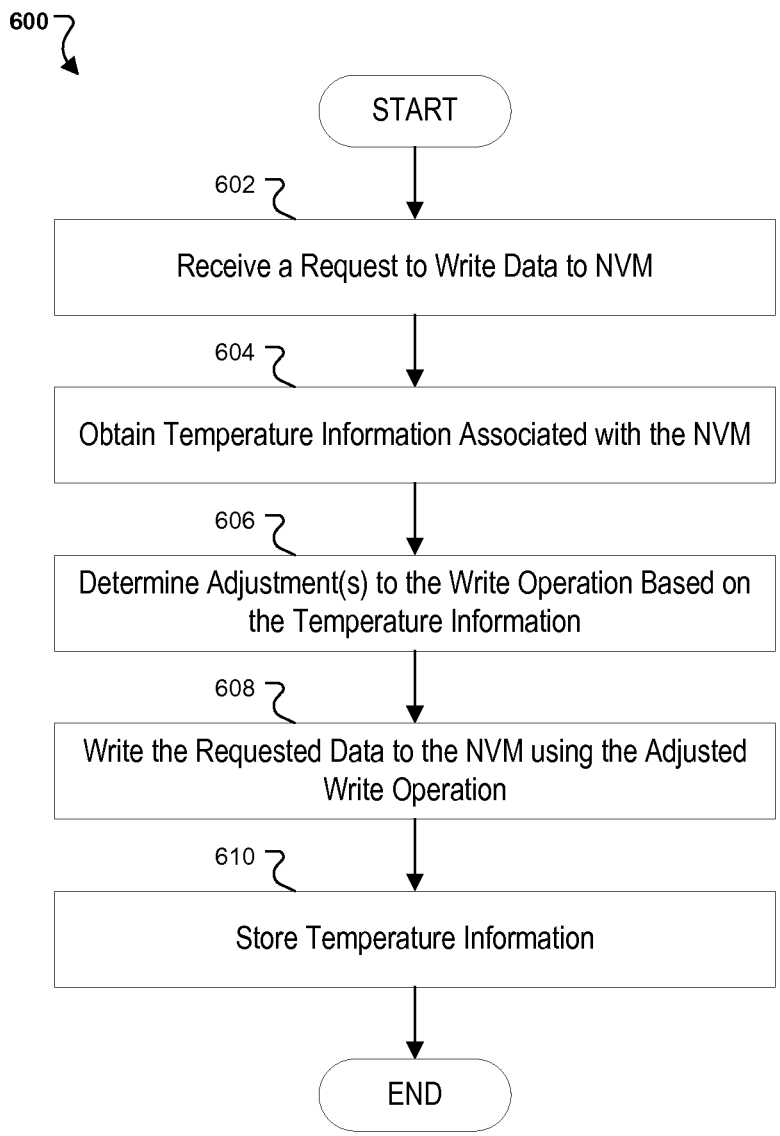
FIG. 6 is a flowchart depicting an example process for writing data to a memory device based on temperature information.

FIG. 6 is a flowchart depicting an example process 600 for writing data to a memory device based on temperature information. The process 600 can be performed by a variety of memory devices, such as the NVM package 104 and/or the host controller 102 described above with regard to FIG. 1, and/or the memory device 202 described above with regard to FIG. 2.

A request to write data to NVM is received at 602. For example, the host controller 102 can transmit a write command to the NVM package 104 over the host communication channel 110.

Temperature information associated with the NVM to which the requested data will be written is obtained at 604. For example, if the memory controller 114 determines that there is sufficient available storage capacity in the NVM 138a, temperature information associated with the NVM 138a can be obtained. For instance, temperature measurements can be received from the temperature sensors 144a and/or other temperature sensors, like the temperature sensors 146 of the NVM package 104.

A determination can be made regarding whether to adjust the requested write operation based on the obtained temperature information at 606. A variety of adjustments to the write operation can be made. For example, voltage thresholds that are used to define voltage distributions corresponding to data values can be adjusted based on the obtained temperature information. One or more temperature algorithms can be used to determine the adjustments to the voltage thresholds, similar to the adjustments discussed above with regard to FIG. 5 and step 508.

In another example, if the obtained temperature information exceeds a threshold level (or is less than a threshold level), then the data can be written redundantly to multiple locations in the NVM. For instance, if the NVM has a high temperature that may potentially result in inaccurate programming of the NVM, then the data can be written redundantly to multiple locations of the NVM so as to improve the likelihood that one or more of the locations will be accurately programmed.

In a further example, the data can be written in SLC mode or MLC based on the obtained temperature. For instance, if the temperature of the NVM exceeds a threshold level above which MLC mode is less reliable, then the data can be written in SLC mode. In contrast, if the temperature of the NVM is below a threshold level at which MLC programming is sufficiently reliable, then the data can be written in MLC mode.

In another example, programming of the requested data can be delayed until the temperature of the NVM to which the data will be written has fallen below and/or raised above a threshold level. For instance, if the temperature of the NVM is so hot that data is unlikely to be accurately programmed, then the write operation can delayed until the temperature has fallen below the threshold level at which programming accuracy improves to an acceptable level. In a further example, programming of the requested data can be changed by adjusting various programming parameters, such as current and/or timing.

The requested data can be written to the NVM using the adjusted write operation at 608. The temperature information for the NVM at the time of programming can be stored at 610. Such stored temperature information can be later retrieved and used to read data from the programmed memory cells, as described above with regard to FIG. 5.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. Moreover, other mechanisms for using temperature information to perform memory operations may be used. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method for performing memory operations, the method comprising:
    receiving, at a memory device, a request to read data from one or more non-volatile memory cells;
    retrieving stored temperature information associated with the non-volatile memory cells, wherein the temperature information is associated with a temperature at approximately a time when the data was written to the non-volatile memory cells;
    reading, by the memory device, the data from the non-volatile memory cells, wherein reading the data from the non-volatile memory cells includes:
        receiving current temperature information indicative of a current temperature associated with the non-volatile memory cells; and
        adjusting one or more voltage thresholds used to interpret the data stored in the non-volatile memory cells depending upon a difference between the stored temperature information and the current temperature information.

2. The method of claim 1, wherein the voltage thresholds are adjusted using an algorithm that maps voltage drift in the non-volatile memory cells based on temperature.

3. The method of claim 2, further comprising:
    performing an error checking operation on the data read from the non-volatile memory cells;
    based on the error checking operation, determining whether the adjustments to the voltage thresholds resulted in an acceptable interpretation of the data; and
    updating the algorithm based on the determination of whether the adjustments resulted in the data being correctly interpreted.

4. The method of claim 1:
    wherein the current temperature information is based upon one or more temperature measurements received from one or more temperature sensors.

5. The method of claim 1, wherein the non-volatile memory cells include flash memory cells.

6. A method for performing memory operations, the method comprising:
    receiving, at a memory device, a request to write data to one or more non-volatile memory cells;
    obtaining, by the memory device, temperature information from one or more temperature sensors indicative of a current temperature associated with the non-volatile memory cells;
    determining an adjustment to make to a write operation based on the temperature information; and
    writing the data to the non-volatile memory cells using the determined adjustment to the write operation based on the temperature information.

7. The method of claim 6, wherein the adjustment to the write operation includes an adjustment to one or more voltage thresholds that define representations of data values stored in the non-volatile memory cells.

8. The method of claim 7, wherein the adjustment to the voltage thresholds is determined using an algorithm that maps voltage drift in the non-volatile memory cells according to the current temperature associated with the nonvolatile memory cells.

9. The method of claim 6, wherein the adjustment to the write operation includes redundantly writing the data when the current temperature, as indicated by the temperature information, exceeds a threshold level.

10. The method of claim 6, wherein the adjustment to the write operation includes changing the write operation (i) from writing more than one bit of data per memory cell to writing one bit of data per memory cell, or (ii) from writing one bit of data per memory cell to writing more than one bit of data per memory cell.

11. The method of claim 10, wherein the write operation is changed from writing more than one bit of data per memory cell to writing one bit of data per memory cell when the write operation is determined to have less than a threshold level of accuracy at the current temperature.

12. The method of claim 6, wherein the adjustment to the write operation includes waiting to perform the write operation until the current temperature has changed over a period of time by at least a threshold amount.

13. The method of claim 6, wherein the non-volatile memory cells are located on a memory die, and wherein at least one of the temperature sensors is located on the same memory die.

14. The method of claim 6, wherein the non-volatile memory cells are located on a memory die, and wherein the temperature sensors are part of the memory device but are not located on the memory die;
the method further comprising inferring the current temperature associated with the non-volatile memory cells based on one or more temperature characteristics that model temperatures of the non-volatile memory cells based on temperature measurements from other parts of the memory device.

15. The method of claim 14, wherein at least one of the temperature sensors is located in the memory device to provide temperature measurements of a memory controller.

16. The method of claim 14, wherein at least one of the temperature sensors is located in the memory device to provide ambient temperature measurements.

17. A memory device comprising:
one or more non-volatile memory cells;
one or more temperature sensors configured to provide temperature measurements associated with the non-volatile memory cells; and
a controller configured to perform memory operations on the non-volatile memory cells wherein, upon receiving a request to read data from one or more non-volatile memory cells the memory controller is further configured to:
retrieve stored temperature information associated with the non-volatile memory cells, wherein the temperature information is associated with a temperature at approximately a time when the data was written to the non-volatile memory cells;
read the data from the non-volatile memory cells, wherein reading the data from the non-volatile memory cells includes:
receiving current temperature information indicative of a current temperature associated with the non-volatile memory cells; and
adjusting one or more voltage thresholds used to interpret the data stored in the non-volatile memory cells depending upon a difference between the stored temperature information and the current temperature information.

18. The memory device of claim 17, wherein the memory controller is configured to store the temperature information in a non-volatile memory.

19. A memory device comprising:
one or more non-volatile memory cells;
one or more temperature sensors configured to provide temperature measurements associated with the non-volatile memory cells; and
a controller configured to perform memory operations on the non-volatile memory cells wherein, upon receiving a request to write data to the non-volatile memory cells, the controller is further configured to:
obtain a current temperature measurement associated with the non-volatile memory cells;
determine an adjustment to make to the write operation based on the current temperature measurement; and
write the data to the non-volatile memory cells using the determined adjustment to the write operation based on the current temperature measurement.

20. The memory device of claim 19, wherein the adjustment to the write operation includes adjusting one or more voltage thresholds that define representations of data values stored in the non-volatile memory cells.

21. The memory device of claim 17, wherein the non-volatile memory cells include flash memory cells.

22. The memory device of claim 19, wherein the adjustment to the write operation includes redundantly writing the data in response to determining that the current temperature measurement exceeds a threshold level.

23. The memory device of claim 19, wherein the adjustment to the write operation includes selectively writing either i) more than one bit of data per memory cell or ii) only one bit of data per memory cell depending upon the current temperature measurement.

24. The memory device of claim 19, wherein the adjustment to the write operation includes selectively either i) performing the write operation or ii) waiting to perform the write operation depending upon the current temperature measurement.

* * * * *